US010122836B2

(12) United States Patent
Lai

(10) Patent No.: US 10,122,836 B2
(45) Date of Patent: Nov. 6, 2018

(54) MAGNETIC CONVECTION COOLING FOR HANDHELD DEVICE

(71) Applicant: Intel Corporation, Santa Clara, CA (US)

(72) Inventor: Min-Tih Lai, Orangeville, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/279,145

(22) Filed: Sep. 28, 2016

(65) Prior Publication Data

US 2018/0087849 A1 Mar. 29, 2018

(51) Int. Cl.
*H01L 23/473* (2006.01)
*G06F 1/20* (2006.01)
*H05K 7/20* (2006.01)
*H04M 1/02* (2006.01)
*H01L 23/36* (2006.01)

(52) U.S. Cl.
CPC .......... *H04M 1/0202* (2013.01); *G06F 1/203* (2013.01); *H01L 23/36* (2013.01); *H01L 23/473* (2013.01)

(58) Field of Classification Search
None
See application file for complete search history.

(56) References Cited

U.S. PATENT DOCUMENTS

| | | |
|---|---|---|
| 6,261,471 B1 | 7/2001 | Tsuda et al. |
| 6,619,044 B2 | 9/2003 | Batchelor et al. |
| 6,658,861 B1 | 12/2003 | Ghoshal et al. |
| 6,705,089 B2 | 3/2004 | Chu et al. |
| 7,095,143 B2 * | 8/2006 | Hsu ........ H01L 23/473 257/E23.098 |
| 7,340,904 B2 * | 3/2008 | Sauciuc .......... F28D 15/00 257/E23.098 |
| 7,973,434 B2 * | 7/2011 | Yazawa .......... F04B 19/006 257/713 |
| 8,730,674 B2 * | 5/2014 | Dede .............. F25B 21/00 165/80.4 |

(Continued)

FOREIGN PATENT DOCUMENTS

| | | | |
|---|---|---|---|
| JP | 01095931 A | * | 4/1989 |
| JP | 2001077571 A | | 3/2001 |

(Continued)

OTHER PUBLICATIONS

International Search Report and Written Opinion dated Dec. 4, 2017 for International Application No. PCT/US2017/048876, 13 pages.

*Primary Examiner* — Robert J Hoffberg
(74) *Attorney, Agent, or Firm* — Schwabe, Williamson & Wyatt, P.C.

(57) ABSTRACT

A handheld device may include a magnetic convection cooling system, which may include a fluid chamber that is in thermal communication with electronic circuitry of the handheld device. The fluid chamber may be closed and may contain a substantially non-gaseous first fluid and a substantially non-gaseous second fluid, wherein first fluid may include a magnetic property different from a magnetic property of second fluid. At least one electromagnet may be selectively activated to move the first and second fluids within the fluid chamber to provide convective cooling of the electronic circuitry.

14 Claims, 8 Drawing Sheets

(56) References Cited

U.S. PATENT DOCUMENTS

| | | | |
|---|---|---|---|
| 9,004,892 B2 * | 4/2015 | Wang | B29C 45/7312 |
| | | | 249/80 |
| 9,341,023 B2 * | 5/2016 | Defretin | E21B 21/00 |
| 2003/0026705 A1 * | 2/2003 | Ishiguro | B01L 3/50273 |
| | | | 417/55 |
| 2006/0045755 A1 * | 3/2006 | McDonald | F04B 17/00 |
| | | | 417/50 |
| 2006/0144566 A1 * | 7/2006 | Jensen | H01L 23/473 |
| | | | 165/104.28 |
| 2006/0278373 A1 * | 12/2006 | Hsu | H01L 23/473 |
| | | | 165/104.33 |
| 2013/0148301 A1 | 6/2013 | Dede et al. | |

FOREIGN PATENT DOCUMENTS

| | | | |
|---|---|---|---|
| JP | 2003078092 A | | 3/2003 |
| JP | 2003101276 A | | 4/2003 |
| KR | 2015067631 A | * | 6/2015 |

* cited by examiner

MAGNETIC CONVECTION COOLING FOR HANDHELD DEVICE

TECHNICAL FIELD

The present disclosure relates generally to handheld devices and more particularly to cooling for such devices.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

Electronic circuitry in handheld devices, such as mobile devices, tablet computers, etc., typically includes a central processing integrated circuit (IC) component that performs a majority of electronic processing for the device and, therefore, generates a greater amount of heat. In some embodiments, a heat spreader or "slug," sometimes referred to as a heat sink, may be positioned in thermal contact with the central processing IC component. The heat spreader may be a flat metal plate, generally about the planar size of the central processing IC component, to distribute across the extent of the heat spreader heat from one or more localized hotspots on the central processing IC component. In embodiments, the heat spreader may be slightly larger than the planar size of the central processing IC component. The heat spreader may normalize the temperature across the surface of the central processing IC component and so may allow it to operate in a higher-performance, higher-power mode for a longer period of time before performance throttling is necessary to reduce the temperature of the central processing IC component.

DETAILED DESCRIPTION

Figure 1A:
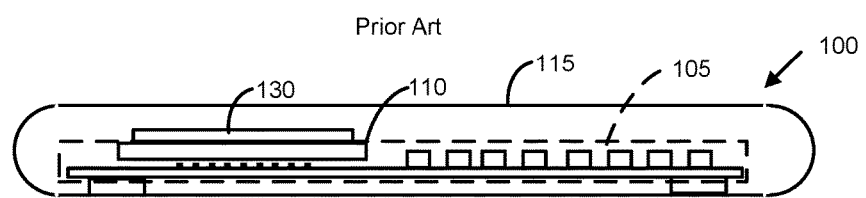
FIGS. 1A and 1B respectively illustrate generally sectional side and plan views of a legacy handheld device.

In the following detailed description, reference is made to the accompanying drawings which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Aspects of the disclosure are disclosed in the accompanying description. Alternate embodiments of the present disclosure and their equivalents may be devised without parting from the spirit or scope of the present disclosure. It should be noted that like elements disclosed below are indicated by like reference numbers in the drawings.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "module" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

Figure 1B:
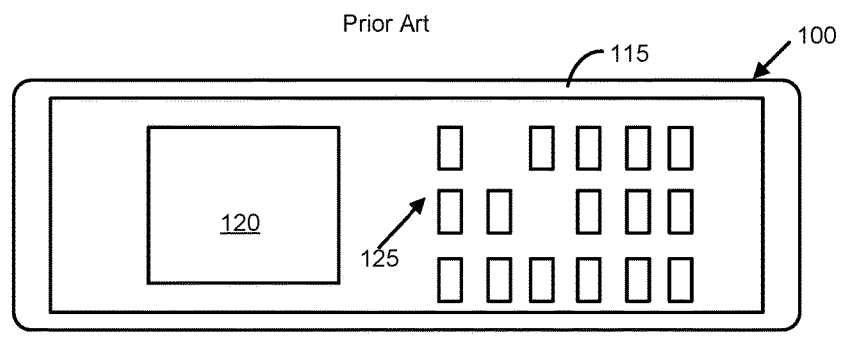

FIGS. 1A and 1B illustrate generally sectional side and plan views of a legacy handheld device 100 that may include electronic circuitry 105, including a central processing integrated circuit (IC) module or component 110 that may perform a majority of electronic processing for the device, contained a case 115. Device 100 may further include a display 120 and a user input 125, which may be formed as one or more separate keys (as illustrated) or may be incorporated into display 120 as a touchscreen user input that may extend substantially across case 115. A heat spreader 130, which may sometimes referred to as a heat sink, may be positioned in thermal contact with the central processing IC component 110. Heat spreader 130 may be a flat metal plate, generally about the planar size of central processing IC component 110, to distribute across the extent of the heat spreader 130 heat from one or more localized hotspots on central processing IC component 110, thereby to normalize the temperature across the surface of central processing IC component 110.

In some other embodiments, legacy handheld device 100 may further include a fan (not shown) to actively move air across heat spreader 130 or, alternatively, a heat sink that may include one or more heat dissipation fins. In these embodiments, the fan may draw into case 115 generally cooler air from the environment, may provide a flow of the air across heat spreader 130, and may expel from case 115 warmer air that carries heat from the system, including central processing IC component 110. These embodiments may reduce hotspots in circuitry 105, including central processing IC component 110, by distributing the heat throughout device 100. Disadvantages of embodiments that include such active air movement may be that the size of the device needs to increase to accommodate the fan, openings for air intake and outflow may subject the device to increased vulnerability to environmental hazards, such as water and particulates, and mechanical components of the fan may susceptible to damage and/or may reduce overall device reliability.

Figure 2A:
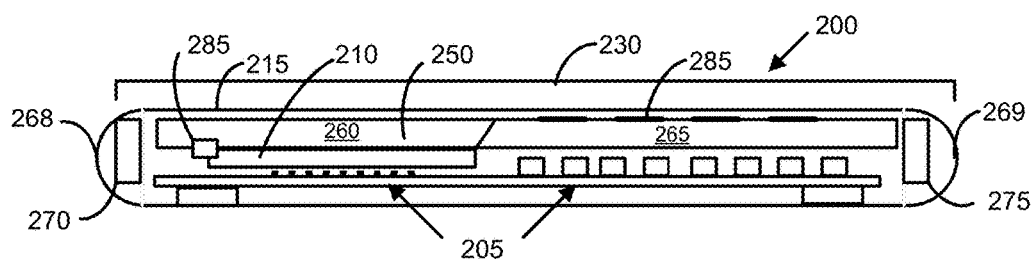
FIGS. 2A and 2B respectively illustrate generally sectional side and plan views of a handheld device that may include magnetic convection cooling according to some embodiments.
Figure 2B:
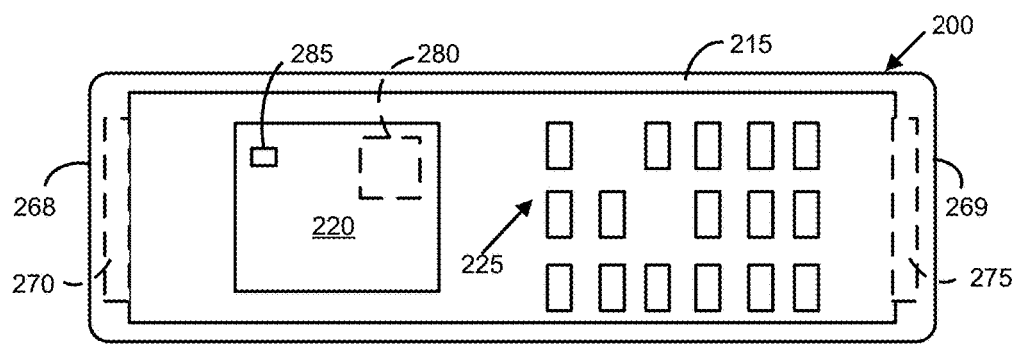

FIGS. 2A and 2B illustrate respective sectional side and plan views of a handheld device 200 according to some embodiments. Device 200 may include electronic circuitry 205, including a central processing integrated circuit (IC) component 210 that may perform a majority of electronic processing for the device, contained within a case 215. Device 200 may further include a display 220 and a user input 225, which may be formed as one or more separate keys (as illustrated) or may be incorporated into display 220 that may extend substantially across case 215 as a touch-screen user input.

Device 200 may include a magnetic convection cooling system 230, which may include a fluid chamber 250 that is in thermal communication with at least processing IC component 210 of electronic circuitry 205. Fluid chamber 250 may be closed and may contain a substantially non-gaseous first fluid 260 and a substantially non-gaseous second fluid 265, wherein first fluid 260 may include a magnetic property different from a magnetic property of second fluid 265, as described below. In embodiments, fluids 260 and 265 may be in generally comparable proportions.

As used herein, a fluid may refer to a substance that may continually deform and/or flow under an applied shear stress and may include various phases of matter, including liquids, gases, some solids, and combinations thereof. A substantially non-gaseous fluid may include various phases of matter, including liquids, some solids, and/or combinations thereof, and may include insignificant and/or incidental amounts of gas, by mass, in an otherwise non-gaseous fluid. As one example, room temperature air is a gas and may be considered a gaseous fluid, rather than a substantially non-gaseous fluid. As another example, room temperature water may be considered a substantially non-gaseous fluid that may include an insignificant and/or incidental amount of dissolved gas, such as air.

Magnetic convection cooling system 230 may further include, adjacent to opposed ends 268 and 269 of fluid chamber 250, a first magnet 270 and a second magnet 275, respectively. In embodiments, magnets 270 and 275 may each be and/or include an electromagnet that may be in communication with and operable in response to a cooling system control 280. Cooling system control 280 (shown as a functional block included in processing IC component 210) may also be in communication with a temperature sensor 285, which may be in thermal contact with central processing IC component 210 and/or fluid chamber 250 in the vicinity of central processing IC component 210. In embodiments, cooling system control 280 may also be in communication with one or more other temperature sensors, which may be in thermal contact with other electronic circuitry 205 and/or fluid chamber 250 in the vicinity of the other electronic circuitry 205. Cooling system control 280 may be implemented and/or operated by central processing IC component 210 in response to instructions stored on device 200 in non-transitory computer-readable media.

In embodiments, first fluid 260 and second fluid 265 may include sufficient heat capacity to conduct heat through fluid chamber 250 from central processing IC component 210. For example, first fluid 260 and second fluid 265 may include heat capacity generally comparable to water and may have a wide range of working temperatures, may be non-reactive, and/or may be non-conductive. In embodiments, fluids 260 and 265 may include dielectric fluids and/or electronic coolant fluids and, in some embodiments, may include polyalphaolefins (PAOs) and/or Fluorinert brand electronic coolant liquid of 3M Company. In embodiments in which fluids 260 and 265 may be isolated from direct contact with electronic components, for example, fluids 260 and/or 265 may include water solutions, which may include ethylene glycol or propylene glycol, so that the fluid or fluids may have freezing and/or boiling temperatures so as not to freeze or boil at the operating conditions and temperatures of device 200. In embodiments, first fluid 260 and second fluid 265 may each include specific heat capacity within a range of 1 to 5 J/g K. For example, water solutions may have specific heat capacities toward the high end of the sample range. As a consideration in some embodiments, fluids with higher density may have higher heat capacity per unit volume than fluids of the same heat capacity, but lower density, and may be desirable in embodiments with limited fluid volume.

The thermal or heat conduction in fluids 260 and 265, as exemplified above, may be relatively dynamic. In embodiments, a heat transfer coefficient may relate to viscosity and/or density of the fluids. The heat transfer coefficient may relate to the velocity of the fluids and/or the level of turbulence/mixing as the fluids move within fluid chamber 250. Embodiments may be directed to achieving an increased heat transfer coefficient while reducing energy to move the fluids with the magnetic field. Embodiments may employ fluids that may reduce corrosion or other reliability problems. In embodiments, example fluids may have heat conductivities of, for example, 0.1 to 0.6 W/m° C., and/or may have dynamic viscosities of, for example, 0.5 to 20 centiPoise, and/or may have densities of, for example, 0.7 to 1.8 g/cc.

Also, as described, first fluid 260 and second fluid 265 may include different magnetic properties. In one embodiment, first fluid 260 may be magnetic in that first fluid 260 may be responsive to a magnetic field and may be attracted to or repelled by a magnetic field. In embodiments, first fluid 260 may include ferrous or ferromagnetic particles in suspension or in a slurry. In embodiments, first fluid 260 may include a magnetic and/or a ferrofluid, such as any of an EMG series brand of ferrofluids that may be available from Ferrotec Corporation. Second fluid 265 may include different magnetic properties, which may include being less magnetic than first fluid 260, or being generally not magnetic and not responsive to a magnetic field. Furthermore, in some embodiments, fluids 260 and 265 may be generally immiscible, in that even if physically intermixed, the fluids would separate from each other. For example, one of fluids 260 and 265 may be generally aqueous-based, and the other may generally have a hydrophobic basis, such as an oil base. As a result, fluids 260 and 265 may be referred to as being complementary with each other.

Figure 3A:
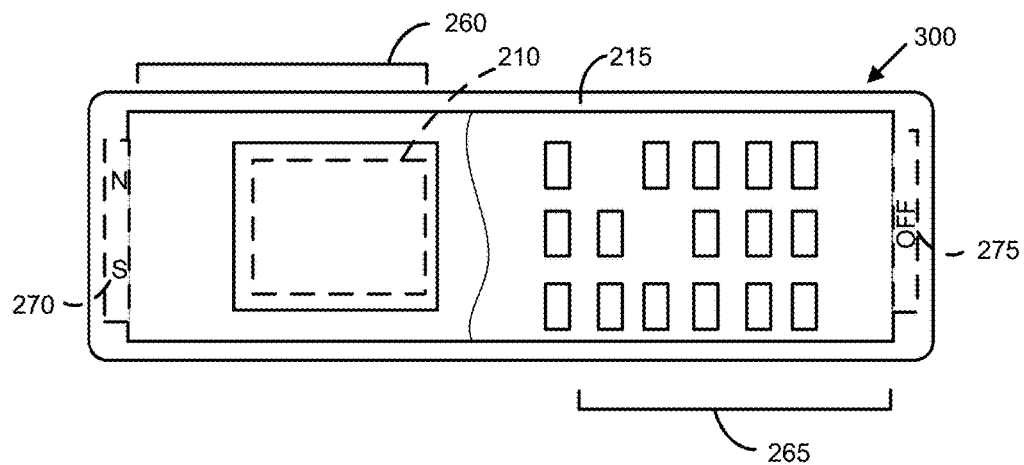
FIGS. 3A and 3B respectively show first and second plan views of a handheld device to illustrate operation of magnetic convection cooling according to some embodiments.
Figure 3B:
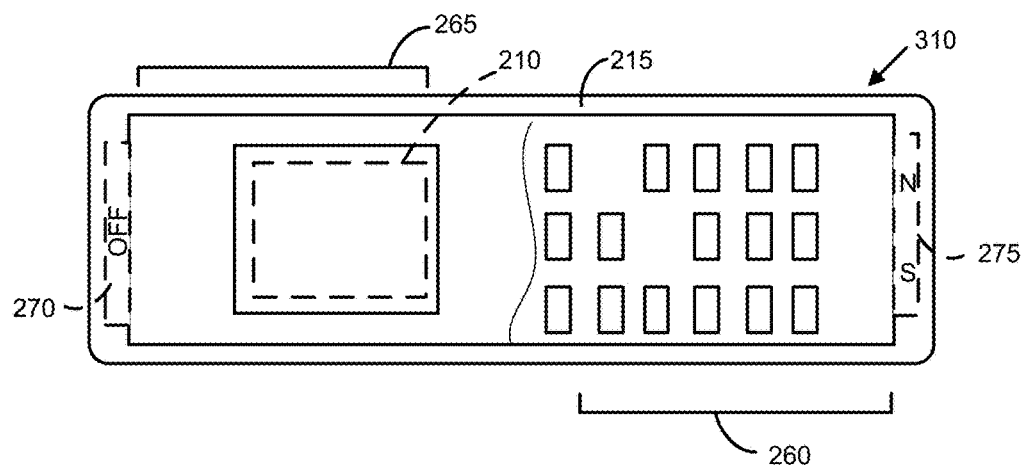

FIGS. 3A and 3B respectively illustrate a first plan view 300 and a second plan view 310 of handheld device 200. FIGS. 3A and 3B illustrate displacement of fluids 260 and 265 within fluid chamber 250 by respective activation of magnets 270 and 275. For purposes of illustration, central processing IC component 210 may be positioned as indicated. It will be appreciated, however, that the following operation of cooling system 230 may be independent the location of central processing IC component 210 within device 200.

For example, first plan view 300 illustrates activation of magnet 270 to generate a magnetic field that may attract first fluid 260 toward magnet 270 at end 268 of fluid chamber 250 and device 200. As a result, first fluid 260 may displace second fluid 265 from that portion of fluid chamber 250 so that fluid 265 moves toward end 269. Magnet 275 may be concurrently de-activated. In this operational phase, first fluid 260 may generally be the fluid in fluid chamber 250 in the vicinity of central processing IC component 210 and may receive heat generated by it.

Second plan view 310 illustrates activation of magnet 275 to generate a magnetic field that may attract first fluid 260 toward magnet 275 at end 269 of fluid chamber 250 and device 200. As a result, first fluid 260 may displace second fluid 265 from that portion of fluid chamber 250 so that fluid 265 moves toward end 268. Magnet 270 may be concurrently de-activated. In this operational phase, fluid 265 may generally be the fluid in fluid chamber 250 in the vicinity of central processing IC component 210 and would receive heat generated by it. Following the operational phase illustrated in first plan view 300, movement of first fluid 260 toward magnet 275 at end 269 of fluid chamber 250 may move or transfer to end 269 heat received by first fluid 260 from central processing IC component 210. In embodiments, device 200 may include an optional heat slug or heat sink 285 (indicated by dashed line) that may be in thermal communication with fluid chamber 250, away from central processing IC component 210, to improve dissipation of heat generated by central processing IC component 210. In other embodiments, fluid chamber 250 may alternatively or may also be in thermal communication with one or more other thermally conductive elements of device 200, such as an antenna, to improve dissipation of heat generated by central processing IC component 210

It will be appreciated that cooling system 230 may alternate between the operational phases of views 300 and 310. As a result, cooling system 230 may transfer and/or distribute between ends 268 and 269 heat generated by circuitry 205, including central processing IC component 210 to provide magnetic convection cooling. In embodiments, cooling system control 280 may cooperate with temperature sensor 285 to transfer fluids 260 and 265 between ends 268 and 269 episodically when temperature sensor 285 indicates a temperature greater than a threshold amount. In these embodiments, cooling may be provided as needed, such as during periods of higher performance or prolonged operation. In other embodiments, cooling system control 280 may transfer fluids 260 and 265 between ends 268 and 269 periodically.

Figure 4:
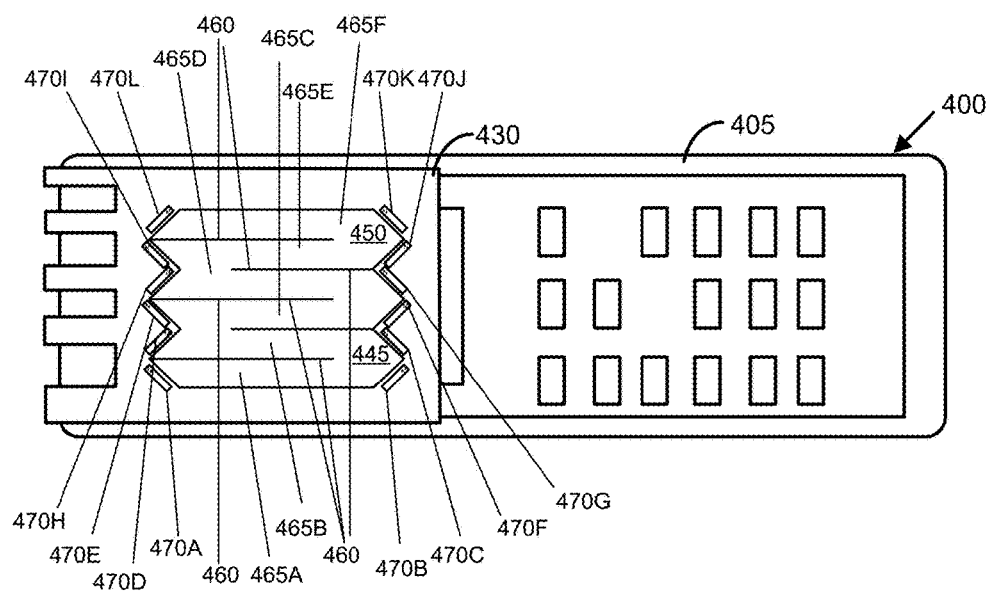
FIG. 4 illustrates a generally plan view of a handheld device according to some alternative embodiments.

FIG. 4 illustrates a generally plan view of a handheld device 400 according to some alternative embodiments. Device 400 may be generally analogous to device 200 and may include within a case 405 analogous electronic circuitry (not shown), including a central processing integrated circuit (IC) component (not shown) that may perform a majority of electronic processing for the device. Device 400 may also include a display and a user input analogous to those of device 200.

Device 400 may include a magnetic convection cooling system 430, which may include a fluid chamber 440, which is shown outside of case 405 for purposes of illustration, but in embodiments is contained within case 405 in thermal communication with at least the central processing IC component of the electronic circuitry. Fluid chamber 440 may be closed and may contain a substantially non-gaseous first fluid 445 and a substantially non-gaseous second fluid 450 that may be analogous to fluids 260 and 265, respectively.

Fluid chamber 440 may include two or more channel guides 460 (e.g., five shown) to form one or more channels (e.g., six shown, 465A-465F) within fluid chamber 440 to channelize movement of fluids 445 and 450. Electromagnets 470A-470L may be positioned at the ends of channels 465A-465F. A cooling system control 480, which may be operated by the central processing IC component, may activate the magnets 470A-470L in sequence to move, for example, first fluid 445 from channels located toward channel 465A to channels located toward channel 465F.

As an illustration of one embodiment, fluids 445 and 450 may be in generally comparable proportions so that each fills about one-half of fluid chamber 440. First fluid 445 in channels located toward channel 465A may also fill channels 465B and 465C. As a result, second fluid 450 may be located toward channel 465F may also fill channels 465D and 465E. From this initial phase, cooling system control 480 may activate electromagnets 470G-470L, in succession, to move fluid 445 toward channel 465F and thereby displace fluid 450 so it moves toward channel 465A. Movement of first fluid 445 from channels located toward channel 465A to channels located toward channel 465F, and vice versa, may provide distribution and transfer of heat generated by the electronic circuitry, including the central processing IC component.

In embodiments, channel guides 460 may further operate as heat dissipation fins of a heat sink. For example, channel guides 460 may be thermally conductive and may extend to and have thermal communication with fluid chamber 440 to provide increased distribution or transfer of heat from fluids 445 and 450. In other embodiments, fluid chamber 440 may include or be thermally couple to one or more external heat dissipation fins 480 also to provide increased distribution or transfer of heat from fluids 445 and 450. External heat dissipation fins 480 may be completely contained within case 405 or may include at least portions that may be exposed at an edge of or beyond case 405.

Figure 5:
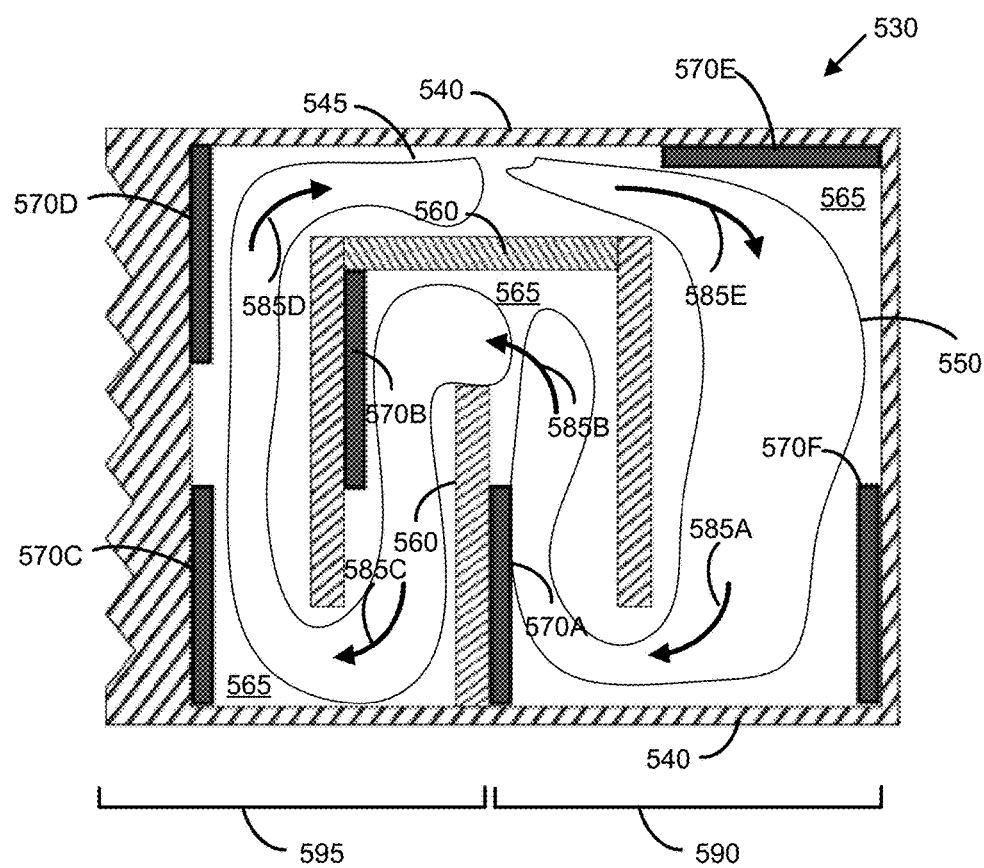
FIG. 5 illustrates a generally plan view of an embodiment of a magnetic convection cooling system.

FIG. 5 illustrates a generally plan view a magnetic convection cooling system 530, which may be analogous to magnetic convection cooling system 430 (FIG. 4) and may be included and/or used in connection with a device such as device 200 and/or 400. Magnetic convection cooling system 530 may include a fluid chamber 540, which in embodiments may be contained within a device case in thermal communication with at least the central processing IC component of the electronic circuitry. Fluid chamber 540 may be closed and may contain a substantially non-gaseous first fluid 545 and a substantially non-gaseous second fluid 550 that may be analogous to fluids 260 and 265 and/or fluids 445 and 450, respectively, and may be in generally comparable proportions. (Fluids 445 and 450 are indicated schematically and, in embodiments, would generally fill fluid chamber 540.)

Fluid chamber 540 may include two or more channel guides 560 (e.g., two shown) to form a channel 565 within fluid chamber 540 to channelize movement of fluids 545 and 550. Channel 565 may form a continuous course or loop. Electromagnets 570A-570F may be positioned along channel 565. A cooling system control (not shown, but analogous to cooling system control 480) may be operated by a central processing IC component, and may activate the magnets 570A-470F in sequence to move, for example, first fluid 545 along channel 565.

Fluid 545 may move or be drawn continuously through or along the continuous course or loop of channel 565 in directions 585A-585E in coordination with successive activation of electromagnets 570A-570F, and may displace and move fluid 550 during the movement of fluid 545. In embodiments, movement of fluid 545 that may cause and/or result in displacement or movement of fluid 550 may correspond and/or be referred to as a plug flow. A region 590 of fluid chamber 540 may be in thermal communication with and heated by central processing IC component of the electronic circuitry, and a region 595 of fluid chamber 540 may extend away from central processing IC component of the electronic circuitry to facilitate cooling of fluids 545 and 550. In some embodiments, region 595 or a portion of it may extend from or outside an interior of a case for the device. In embodiments, channel guides 560 may further operate as heat dissipation fins of a heat sink. For example, channel guides 560 may be thermally conductive and may extend to and have thermal communication with fluid chamber 540 to provide increased distribution or transfer of heat from fluids 545 and 550.

Figure 6:
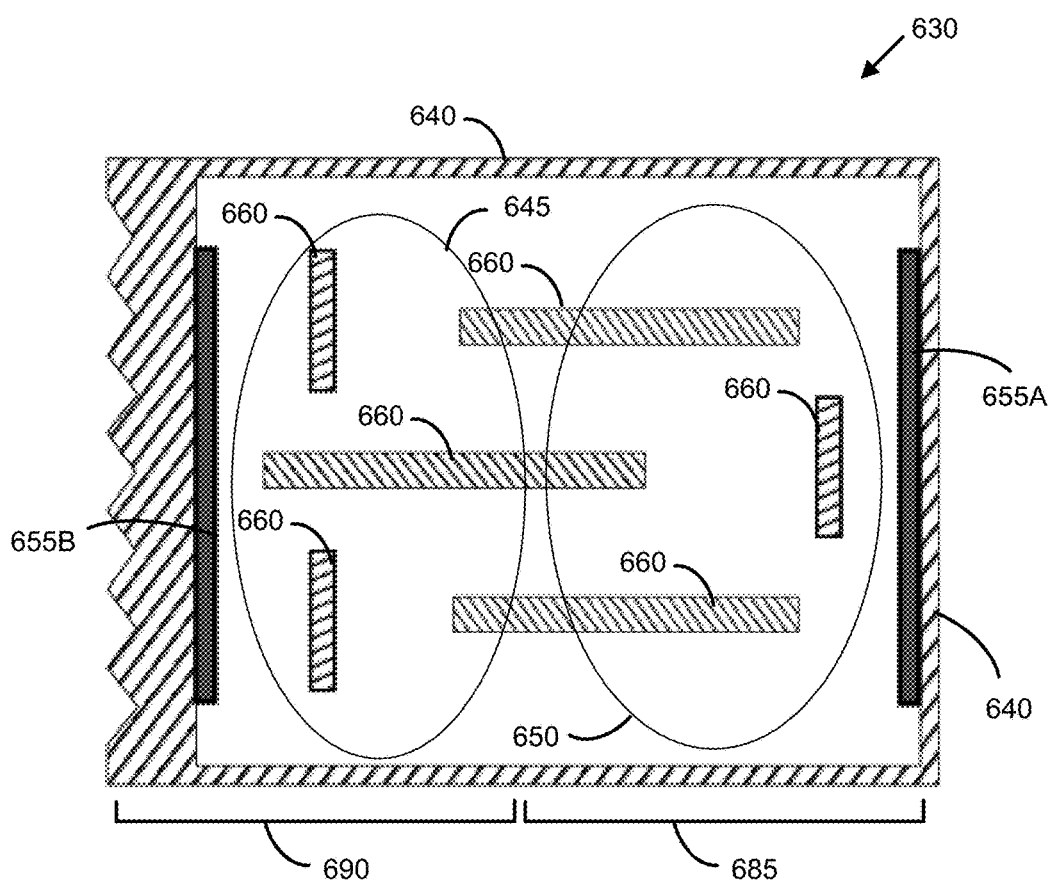
FIG. 6 illustrates a generally plan view of another embodiment of a magnetic convection cooling system.

FIG. 6 illustrates a generally plan view a magnetic convection cooling system 630, which may be analogous to magnetic convection cooling system 230 (FIG. 2) and may be included and/or used in connection with a device such as device 200. Magnetic convection cooling system 630 may include a fluid chamber 640, which in embodiments may be contained within a device case in thermal communication with at least the central processing IC component of the electronic circuitry. Fluid chamber 640 may be closed and may contain a substantially non-gaseous first fluid 645 and a substantially non-gaseous second fluid 650 that may be analogous to fluids 260 and 265 and/or fluids 445 and 450 and/or fluids 545 and 550, respectively, and may be in generally comparable proportions. (Fluids 645 and 650 are indicated schematically and, in embodiments, would generally fill fluid chamber 640.)

A pair of electromagnets 655A and 655B may be positioned at or adjacent opposite sides of fluid chamber 640, which may include two or more chamber guides 660 (e.g., six shown) that may disrupt, divert, and/or hamper fluid flow between electromagnets 655A and 655B. A cooling system control (not shown, but analogous to cooling system control 280) may be operated by a central processing IC component, and may activate the magnets 655A and 655B in alternation to move, for example, first fluid 645 back and forth across fluid chamber 640. For example, movement of fluid 545 in response to of activation of electromagnets 655A and 655B may displace fluid 650 during the movement. In embodiments, a region 685 of fluid chamber 640 may be in thermal communication with and heated by central processing IC component of the electronic circuitry, and a region 690 of fluid chamber 640 may extend away from central processing IC component of the electronic circuitry to facilitate cooling of fluids 645 and 650. In some embodiments, region 690 or a portion of it may extend from or outside an interior of a case for the device.

In embodiments, one or more chamber guides 660 may be generally parallel to pathways between electromagnets 655A and 655B, and one or more chamber guides 660 may extend at least partly across and/or transverse to pathways between electromagnets 655A and 655B. Chamber guides 660 may disrupt, divert, and/or hamper fluid flow between electromagnets 655A and 655B. Chamber guides 660 may function as obstructions that may change fluid flow directions, channel sizes, and/or flow speeds and so may increase turbulence of fluids 645 and 650, which may increase the transfer of heat from region 685 to region 690. In embodiments, an amount of turbulence may be estimated by Reynold's number (Re) according to flow speed and channel size, for example. In embodiments, chamber guides 660 may be thermally conductive and may extend to and have thermal communication with fluid chamber 640 to provide increased distribution or transfer of heat from fluids 645 and 550. In other embodiments, chamber guides 660 may extend only partly into fluid chamber 640 as ridges.

Figure 7:
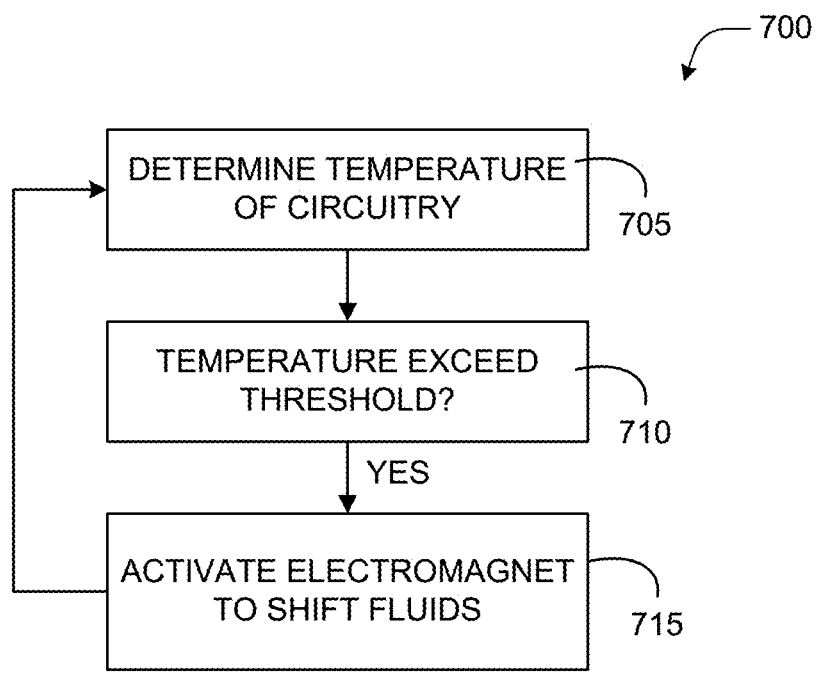
FIG. 7 is a flow diagram of magnetic convection cooling of a handheld device, according to some embodiments.

FIG. 7 is a flow diagram of a magnetic convection cooling technique 700 of a handheld device, wherein the device may include first and second electromagnets positioned at respective first and second sides or ends of a fluid chamber in thermal communication with circuitry of the device. The fluid chamber may include first and second fluids that are substantially non-gaseous and the first fluid may include a magnetic property different from the second fluid.

At 705, a temperature relating to electronic circuitry of a device may be determined. In embodiments as illustrated in FIG. 2, for example, a temperature sensor 285 may be in thermal contact with selected electronic circuitry, such as central processing IC component 210, and/or with fluid chamber 270 in the vicinity of central processing IC component 210, and may provide a temperature signal relating to the central processing IC component 210.

At 710, determination may be made whether the temperature relating to electronic circuitry exceeds a threshold. In embodiments, cooling system control 280 may receive the temperature signal to determine the temperature or of in the vicinity of central processing IC component 210 exceeds a threshold temperature.

At 715, upon determination that the temperature relating to electronic circuitry exceeds a threshold, activating one of the first and second electromagnets to shift the first and second fluids within the fluid chamber. Return to operation 705.

It will be appreciated that the operation of FIG. 7 may provide selectively and/or alternating activation of the first and second electromagnets to selectively and/or alternatingly position the first fluid in the fluid chamber relative to the first electromagnet.

Figure 8:
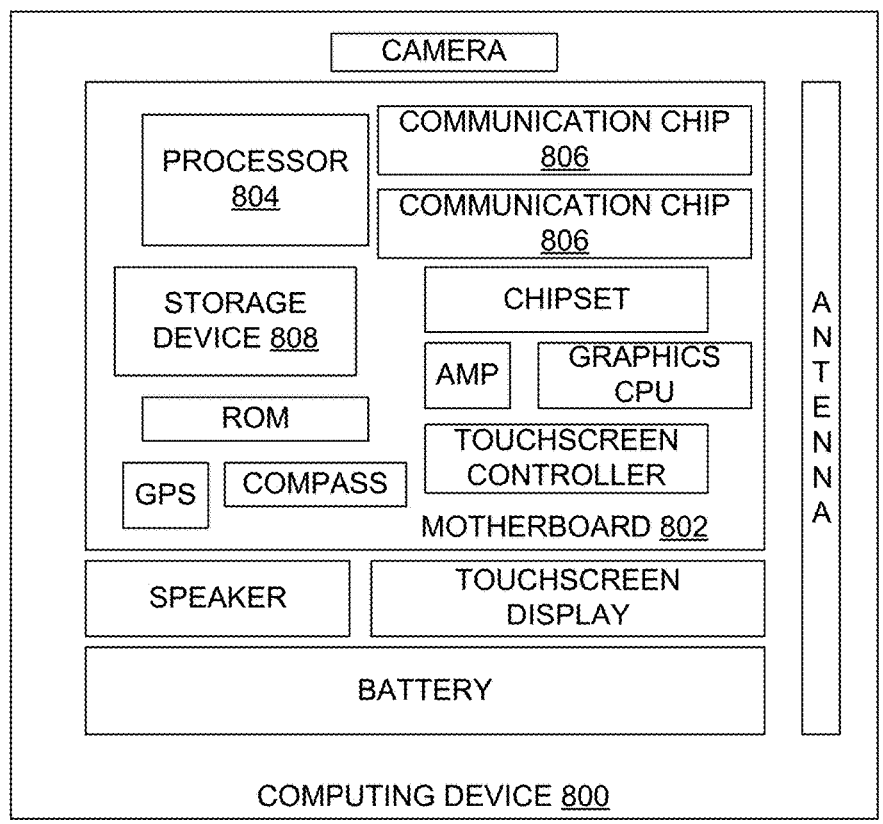
FIG. 8 schematically illustrates a computing device which, in accordance with some embodiments, may include one or more of devices of FIGS. 2A, 2B, 3A, 3B, and/or 4.

FIG. 8 schematically illustrates a computing device 800 which, in accordance with some embodiments, may include one or more of devices 200, 300, 310, and/or 400. In embodiments, central processing IC component 210 of devices 200, 300, 310, and/or 400 may include one or more elements the computing device 800, such as a processor 804.

The computing device 800 may be, for example, a mobile communication device or a desktop or rack-based computing device. The computing device 800 may house a board such as a motherboard 802. The motherboard 802 may include a number of components, including (but not limited to) a processor 804 and at least one communication chip 806. Any of the components discussed herein with reference to the computing device 800 may be arranged in or coupled with a package such as discussed herein. In further implementations, the communication chip 806 may be part of the processor 804.

The computing device 800 may include a storage device 808. In some embodiments, the storage device 808 may include one or more solid state drives. Examples of storage devices that may be included in the storage device 808 include volatile memory (e.g., dynamic random access memory (DRAM)), non-volatile memory (e.g., read-only memory, ROM), flash memory, and mass storage devices (such as hard disk drives, compact discs (CDs), digital versatile discs (DVDs), and so forth).

Depending on its applications, the computing device 800 may include other components that may or may not be physically and electrically coupled to the motherboard 802. These other components may include, but are not limited to, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, and a camera.

The communication chip 806 and the antenna may enable wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible broadband wide region (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 806 may operate in accordance with a Global System for Mobile Communications (GSM), General Packet Radio Service (GPRS), Universal Mobile Telecommunications System (UMTS), High Speed Packet Access (HSPA), Evolved HSPA (E-HSPA), or LTE network. The communication chip 806 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 806 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 806 may operate in accordance with other wireless protocols in other embodiments.

The computing device 800 may include a plurality of communication chips 806. For instance, a first communication chip 806 may be dedicated to shorter range wireless communications such as Wi-Fi and Bluetooth, and a second communication chip 806 may be dedicated to longer range wireless communications such as GPS, EDGE, GPRS, CDMA, WiMAX, LTE, EV-DO, and others. In some embodiments, the communication chip 806 may support wired communications. For example, the computing device 800 may include one or more wired servers.

The processor 804 and/or the communication chip 806 of the computing device 800 may include one or more dies or other components in an IC package. Such an IC package may be coupled with an interposer or another package using any of the techniques disclosed herein. The term "processor" may refer to any device or portion of a device that processes electronic data from registers and/or memory to transform that electronic data into other electronic data that may be stored in registers and/or memory.

In various implementations, the computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

Thus various example embodiments of the present disclosure have been described including, but are not limited to:

Example 1 may include a handheld device, which may comprise first and second fluids that are substantially non-gaseous and within a fluid chamber that is in thermal communication with circuitry, wherein the first fluid includes a magnetic property different from the second fluid; a first electromagnet positioned at a first side of the fluid chamber; and control circuitry to selectively activate the first electromagnet to position the first fluid in the fluid chamber relative to the first electromagnet.

Example 2 may include the handheld device of example A1 wherein the control circuitry is to selectively activate the first electromagnet to position the first fluid in the fluid chamber toward the first electromagnet.

Example 3 may include the handheld device of example 1 and may further include a second electromagnet positioned at a second side of the fluid chamber in opposition to the first side and wherein the control circuitry is further to selectively activate the second electromagnet to position the first fluid in the fluid chamber relative to the second electromagnet.

Example 4 may include the handheld device of example 3 wherein the control circuitry may be to alternately activate the first and second electromagnets to position the first fluid in the fluid chamber toward the first and second electromagnets, respectively.

Example 5 may include the handheld device of example 3 wherein the fluid chamber may include at least first and second channel guides that may channelize the first and second fluids between the first and second sides of the fluid chamber.

Example 6 may include the handheld device of example 1 wherein the first and second fluids may include respective first and second liquids.

Example 7 may include the handheld device of example 1 wherein the first and second liquids may be immiscible.

Example 8 may include the handheld device of example 1 and may further include a temperature sensor in communication with the control circuitry to detect a temperature of the handheld device, and wherein the control circuitry may be to selectively activate the first electromagnet in response to the temperature.

Example 9 may include the handheld device of example 1 wherein the first and second fluids may be thermally conductive.

Example 10 may include the handheld device of example 1 in which the device includes a mobile telephone.

Example 11 may include a method, which may comprise: selectively activating a first electromagnet positioned at a first side of a fluid chamber in thermal communication with circuitry of a handheld device, the fluid chamber including first and second fluids that are substantially non-gaseous, wherein the first fluid may include a magnetic property different from the second fluid, to position the first fluid in the fluid chamber relative to the first electromagnet; selectively de-activating the first electromagnet; and selectively activating a second electromagnet positioned at a second side of the fluid chamber to position the first fluid in the fluid chamber relative to the second electromagnet.

Example 12 may include the method of example 11 and may further include detecting a temperature of the handheld device and selectively activating one of the first and second electromagnets based on the temperature.

Example 13 may include the method of example 11 wherein selectively activating the first electromagnet is to position the first fluid in the fluid chamber toward the first electromagnet.

Example 14 may include the method of example 11 further including selectively activating a third electromagnet positioned between the first and second sides of the fluid chamber, in succession with selectively activating the first and second electromagnets, to position the first fluid in the fluid chamber in successive locations relative to the first, second, and third electromagnets.

Example 15 may include the method of example 14, wherein the fluid chamber includes plural channels and wherein the method further includes selectively activating a third electromagnet positioned between the first and second sides of the fluid chamber, in succession with selectively activating the first and second electromagnets, to position the first fluid in successively through the plural channels.

Example 16 may include a handheld device, which may comprise: circuitry; a fluid chamber in thermal communication with the circuitry; substantially non-gaseous fluid cooling means contained within the fluid chamber; and fluid positioning means to position the substantially non-gaseous fluid cooling means within the fluid chamber.

Example 17 may include the handheld device of example 16 wherein the fluid positioning means may include an electromagnet positioned at a first side of the fluid chamber.

Example 18 may include the handheld device of example 17 wherein the fluid positioning means may further include control circuitry to selectively activate the electromagnet according to a temperature of the circuitry.

Example 19 may include the handheld device of example 17 wherein the fluid positioning means may further include a second electromagnet positioned at a second side of the fluid chamber in opposition to the first side and wherein the control circuitry may be further to selectively activate the first and second electromagnets in alternation.

Example 20 may include the handheld device of example 16 wherein the substantially non-gaseous fluid cooling means may include first and second immiscible substantially non-gaseous fluids and at least one of the first and second substantially non-gaseous fluids may be magnetic.

It will be apparent to those skilled in the art that various modifications and variations can be made in the disclosed embodiments of the disclosed device and associated methods without departing from the spirit or scope of the disclosure. Thus, it is intended that the present disclosure covers the modifications and variations of the embodiments disclosed above provided that the modifications and variations come within the scope of any claims and their equivalents.

What is claimed is:

1. A handheld device, comprising:
   a first fluid and a second fluid that are substantially non-gaseous and within a fluid chamber that is in thermal communication with electronic circuitry, wherein the first fluid includes a magnetic property different from the second fluid;
   a first electromagnet positioned at a first side of the fluid chamber;
   a second electromagnet positioned at a second side of the fluid chamber;
   a temperature sensor that is in thermal communication with a component of the electronic circuitry; and
   control circuitry in communication with the temperature sensor, wherein the control circuitry is to:
   determine whether a temperature of the component exceeds a threshold temperature; and
   alternate activation of the first electromagnet and the second electromagnet in response to determination that the temperature of the component exceeds the threshold temperature, wherein the first fluid and the second fluid are to change locations based on the alternate activation.

2. The handheld device of claim 1 wherein the control circuitry is to selectively activate the first electromagnet to position the first fluid in the fluid chamber toward the first electromagnet.

3. The handheld device of claim 1 further wherein the second electromagnet is positioned at the second side of the fluid chamber in opposition to the first side and wherein the control circuitry is further to selectively activate the second electromagnet to position the first fluid in the fluid chamber relative to the second electromagnet.

4. The handheld device of claim 3 wherein the control circuitry is to alternately activate the first electromagnet and the second electromagnet to position the first fluid in the fluid chamber toward the first electromagnet and the second electromagnet, respectively.

5. The handheld device of claim 3 wherein the fluid chamber includes at least a first channel guide and a second channel guide that channelize the first fluid and the second fluid between the first side and the second side of the fluid chamber.

6. The handheld device of claim 1 wherein the first fluid and the second fluid include respective a first liquid and a second liquid.

7. The handheld device of claim 6 wherein the first liquid and the second liquid are immiscible.

8. The handheld device of claim 1 wherein the control circuitry is to selectively activate the first electromagnet in response to the temperature of the component.

9. The handheld device of claim 1 wherein the first fluid and the second fluid are thermally conductive.

10. The handheld device of claim 1 in which the handheld device includes a mobile telephone.

11. The handheld device of claim 1, wherein the component is a central processing integrated circuit (IC) component.

12. A handheld device, comprising:
   electronic circuitry;
   a fluid chamber in thermal communication with the electronic circuitry;
   a means for determining a temperature of a component of the electronic circuitry;
   a means for cooling a portion of the handheld device, wherein the means for cooling includes a first substantially non-gaseous fluid and a second substantially non-gaseous fluid contained within the fluid chamber;
   a means for positioning the means for cooling within the fluid chamber, wherein the means for positioning includes a first electromagnet positioned at a first side of the fluid chamber and a second electromagnet positioned at a second side of the fluid chamber; and a means for activating the means for positioning, wherein the means for activating is to:
  determine whether the temperature of the component exceeds a threshold temperature based on an output of the means for determining; and
  alternatively activate the first electromagnet and the second electromagnet to reposition the means for cooling in response to determination that the temperature of the component exceeds the threshold temperature, wherein the first fluid and the second fluid are to change locations based on alternate activation of the first electromagnet and the second electromagnet.

13. The handheld device of claim 12 wherein the means for activating includes control circuitry to alternatively activate the first electromagnet and the second electromagnet in response to the determination that the temperature of the component exceeds the threshold temperature.

14. The handheld device of claim 12 wherein the first fluid and the second fluid are immiscible, and wherein at least one of the first fluid and the second fluid is magnetic.

* * * * *